(12) United States Patent
Vogt et al.

(10) Patent No.: US 11,785,848 B2
(45) Date of Patent: Oct. 10, 2023

(54) HEAT TO ELECTRIC CONVERSION

(71) Applicant: Battle Sight Technologies, LLC, Dayton, OH (US)

(72) Inventors: Christopher J. Vogt, Cincinnati, OH (US); Nicholas R. Ripplinger, Springboro, OH (US); Ryan D. Snyder, Dayton, OH (US); Sunny L. Kapka, Dayton, OH (US)

(73) Assignee: Battle Sight Technologies, LLC, Dayton, OH (US)

( * ) Notice: Subject to any disclaimer, the term of this patent is extended or adjusted under 35 U.S.C. 154(b) by 0 days.

(21) Appl. No.: 17/737,644

(22) Filed: May 5, 2022

(65) Prior Publication Data

US 2023/0046806 A1 Feb. 16, 2023

Related U.S. Application Data

(60) Provisional application No. 63/187,869, filed on May 12, 2021.

(51) Int. Cl.
*F41A 13/12* (2006.01)
*H10N 10/13* (2023.01)

(52) U.S. Cl.
CPC ............. *H10N 10/13* (2023.02); *F41A 13/12* (2013.01)

(58) Field of Classification Search
None
See application file for complete search history.

(56) References Cited

U.S. PATENT DOCUMENTS

| | | | | |
|---|---|---|---|---|
| 4,732,619 | A | * 3/1988 | Nanigian | G01K 7/06 29/595 |
| 5,856,210 | A | * 1/1999 | Leavitt | H10N 10/01 438/54 |
| 6,461,752 | B1 | * 10/2002 | Leung | F41A 13/12 310/40 MM |
| 7,525,203 | B1 | 4/2009 | Racho | |
| 8,450,895 | B1 | * 5/2013 | Howard | H01Q 3/08 310/80 |
| 8,686,576 | B1 | 4/2014 | Smith | |

(Continued)

OTHER PUBLICATIONS

Rusenko, A. et al.; "Photovoltaic Panel-Gun Barrel Thermoelectric Generator Radio Charging System"; Harris Corporation; Dec. 15, 2012.

*Primary Examiner* — Derrick R Morgan
(74) *Attorney, Agent, or Firm* — Thomas E. Lees, LLC

(57) ABSTRACT

An energy conversion system for use in a rifle with a barrel and a handguard includes an interface with a curved surface that conforms substantially to a curvature of the barrel such that the curved surface receives heat from the barrel. The interface further includes a substantially flat mounting surface and a heat-conducting material disposed between the curved surface and the substantially flat mounting surface to conduct the heat from the curved surface to the substantially flat mounting surface. Moreover, a spring is positioned to be between the interface and the handguard to apply a force to the interface so that the curved surface substantially maintains contact with the barrel. A thermoelectric generator is secured to the substantially flat mounting surface and includes a positive lead and a negative lead.

12 Claims, 5 Drawing Sheets

(56) References Cited

U.S. PATENT DOCUMENTS

| | | | | |
|---|---|---|---|---|
| 8,783,154 | B1* | 7/2014 | Windham | F41A 13/12 89/14.1 |
| 10,079,561 | B1* | 9/2018 | Boyd | H01J 45/00 |
| 2008/0173537 | A1* | 7/2008 | DeSteese | H10N 10/01 204/192.25 |
| 2009/0047453 | A1* | 2/2009 | Folaron | F41H 5/007 428/221 |
| 2010/0288116 | A1* | 11/2010 | Cincotti | F41H 3/00 89/938 |
| 2012/0024333 | A1* | 2/2012 | Lee | C04B 35/645 264/28 |
| 2013/0341553 | A1* | 12/2013 | Amarel | F41A 21/34 252/62 |
| 2014/0076135 | A1* | 3/2014 | Balthaser | F41A 13/12 89/14.1 |
| 2014/0163664 | A1* | 6/2014 | Goldsmith | A61B 17/0057 604/93.01 |
| 2015/0357548 | A1* | 12/2015 | Lee | H10N 10/01 438/54 |
| 2016/0356567 | A1* | 12/2016 | Bybee | F41C 23/16 |
| 2017/0059279 | A1* | 3/2017 | Houde-Walter | F41G 3/145 |
| 2018/0266784 | A1* | 9/2018 | Guy | F41C 27/00 |
| 2019/0078857 | A1* | 3/2019 | Vergara | H10N 10/853 |
| 2019/0390929 | A1* | 12/2019 | Libotte | F41A 21/00 |
| 2023/0085548 | A1* | 3/2023 | Hopkins | F21L 4/00 372/29.01 |
| 2023/0138919 | A1* | 5/2023 | Rastegar | H10N 10/17 136/205 |

* cited by examiner

HEAT TO ELECTRIC CONVERSION

CROSS REFERENCE TO RELATED APPLICATIONS

This application claims the benefit of U.S. Provisional Patent Application Ser. No. 63/187,869, filed May 12, 2021, entitled "HEAT TO ELECTRIC CONVERSION," the disclosure of which is hereby incorporated by reference as if expressly set forth in its entirety.

BACKGROUND

Field of the Disclosure

The present disclosure relates generally to the generation of electricity, and more particularly, to the conversion of heat energy into electric energy.

Description of Related Art

A thermoelectric effect is the conversion of a temperature difference into electricity. The thermoelectric effect can also work in reverse, converting electricity to a temperature difference. A device that implements the thermoelectric effect is known as a thermocouple, which typically includes two dis-similar electrical conductors forming an electrical junction.

SUMMARY

According to aspects of the present disclosure, a system comprises an interface with a contact surface that substantially conforms to at least a portion of a structure providing a source of heat. Further, the interface includes a mounting surface. Moreover, the system comprises a thermoelectric generator secured to the mounting surface of the interface. In some embodiments, the system also comprises a biasing structure that applies a force to the interface so that the contact surface substantially maintains contact with the structure providing the source of heat.

According to further aspects of the present disclosure, an energy conversion device comprises an interface with a contact surface that conforms substantially to at least a portion of a structure providing a source of heat (e.g., a firearm). Further, the interface includes a mounting surface. Moreover, the energy conversion device includes a thermoelectric generator secured to the mounting surface of the interface. The energy conversion device is dimensioned to fit inside a handguard of a firearm such that the contact surface of the interface contacts a barrel of the firearm.

According to yet further aspects of the present disclosure, an energy conversion system for use in a rifle with a barrel and a handguard includes an interface with a curved surface that conforms substantially to a curvature of the barrel such that the curved surface receives heat from the barrel. The interface further includes a substantially flat mounting surface and a heat-conducting material (or body) disposed between the curved surface and the substantially flat mounting surface to conduct the heat from the curved surface to the substantially flat mounting surface. Moreover, a spring is positioned to be between the interface and the handguard to apply a force to the interface so that the curved surface substantially maintains contact with the barrel. A thermoelectric generator is secured to the substantially flat mounting surface.

In some embodiments, the thermoelectric generator includes a pair of wires, e.g., functioning as a positive lead and a negative lead. The wires may be utilized, for instance, for electrically coupling the positive lead to a positive terminal of a battery and a negative lead for electrically coupling to a negative terminal of the battery. In other embodiments, the pair of wires couple to an electrical management system (which itself may include a battery and other circuitry, e.g., a DC-DC (direct current) convertor, filter, regulator, load(s), etc.). In yet other embodiments, the pair of wires connect to a load, circuit, signal conditioner, device, combination thereof, etc.

According to aspects of the present disclosure, a firearm has a barrel, a handguard covering at least a portion of the barrel, and an energy conversion device within the handguard. The energy conversion device includes an interface with a curved surface that conforms substantially to a curvature of the barrel such that the curved surface can receive heat from the barrel. Further, the interface includes a substantially flat mounting surface and a heat-conducting material disposed between the curved surface and the substantially flat mounting surface. The heat-conducting material conducts the heat from the curved surface to the substantially flat mounting surface. Moreover, a spring is positioned between the interface and the handguard to apply a force to the interface so that the curved surface substantially maintains contact with the barrel. A thermoelectric generator is secured to the substantially flat mounting surface.

In some embodiments, the thermoelectric generator includes a pair of wires, e.g., functioning as a positive lead and a negative lead. The wires may be utilized, for instance, for electrically coupling the positive lead to a positive terminal of a battery and a negative lead for electrically coupling to a negative terminal of the battery. In other embodiments, the pair of wires couple to an electrical management system (which itself may include a battery and other circuitry, e.g., a DC-DC (direct current) convertor, filter, regulator, load(s), etc.). In yet other embodiments, the pair of wires connect to a load, circuit, signal conditioner, device, combination thereof, etc.

BRIEF DESCRIPTION OF THE DRAWINGS

Many aspects of the disclosure can be better understood with reference to the following drawings. The components in the drawings are not necessarily to scale, emphasis instead being placed upon clearly illustrating the principles of the present disclosure. Moreover, in the drawings, like reference numerals designate corresponding parts throughout the several views.

DETAILED DESCRIPTION OF THE EMBODIMENTS

Figure 1:
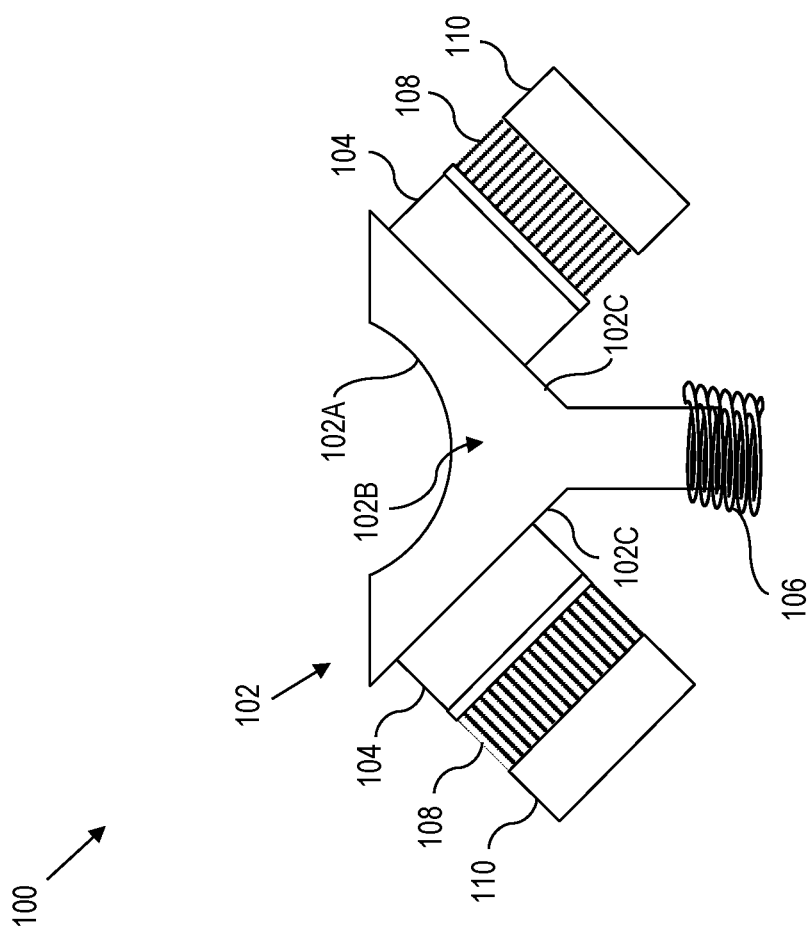
FIG. 1 is a view of an energy conversion device that converts heat energy into electrical energy.

Referring now to the drawings and in particular to FIG. 1, an energy conversion device 100 is illustrated. The energy conversion device 100 includes, in general, an interface 102 and a thermoelectric generator 104.

As will be described in greater detail herein, the interface 102 is configured to conduct heat. More particularly, the interface 102 is provided to transfer heat from a heat source (not shown) to the thermoelectric generator 104. In practical applications, the interface 102 serves to adapt to the shape geometry of a structure providing the source of heat, e.g., to extend along a curved surface such as the barrel of a rifle, etc. In this regard, the interface 102 may make intimate physical contact with the heat source. By way of example, the interface 102 includes a contact surface 102A (which, in practice can be any shape that conforms to the shape of the heat source, e.g., curved in the illustrated example). The interface 102 also includes a body 102B. The interface 102 further includes a mounting surface 102C, which is illustrated as a generally flat surface upon which the thermoelectric generator 104 is attached. Thus, in the example embodiment, the body 102B defines a material or substrate that couples the contact surface 102A to the mounting surface 102C. In practice, heat from the heat source thus couples through the contact surface 102A, through the interface body 102B to the mounting surface 102C to the thermoelectric generator 104. In practical applications, there can be one or more contact surfaces 102A, one or more mounting surfaces 102C, or any combination thereof.

The thermoelectric generator 104 can, in practice, comprise a single thermoelectric device, or multiple thermoelectric devices. For instance, as illustrated, the interface 102 is configured to have one or more mounting surfaces 102C upon which thermoelectric device(s) are mounted. In practical examples, the thermoelectric device is any device that converts heat energy to electrical energy. Where multiple devices are provided, such devices can be electrically coupled together (in parallel, series, etc.), or one or more thermoelectric devices can be electrically wired independently. For instance, as illustrated, there are two mounting surfaces 102C, and thus one or more thermoelectric device(s) can optionally be mounted on each mounting surfaces 102C.

In FIG. 1, the illustration is schematic, and hence, the electrical wiring is omitted for sake of clarity of illustration. However, in practical applications, the electrical connections are made so as to couple the output of the thermoelectric generator 104 to a corresponding circuit and/or device, e.g., a load such as a battery, electrical management system (which itself may include a battery and other circuitry, e.g., a DC-DC (direct current) convertor, filter, regulator, load(s), etc.), circuit, or other structure that can receive the power generated by the thermoelectric generator 104.

In some embodiments, the energy conversion device 100 also includes a biasing structure 106. The biasing structure 106 can be a spring, resilient material, wedge, support, other structure, combination of structures, etc., that is/are capable of cooperating to assist the interface 102 in making contact with the heat source. The function of the biasing structure 106 is described in greater detail herein.

In some embodiments, additional components can include a heat sink 108. The heat sink 108 is provided to help cool the thermoelectric generator 104, and thus makes thermal contact with the thermoelectric generator 104.

In some embodiments a shield 110 is provided. The shield 110 is provided as a protective layer that can serve to protect the energy conversion device 100 and/or to protect a user from heat associated with the energy conversion device 100.

In other practical applications, there can be other components, such as layers of thermal paste, etc. For instance, thermal paste can be applied between the heat sink 108 and thermoelectric generator 104, etc.

As noted more fully above, the present disclosure provides systems and methods for converting heat from to electricity. One particular application is to convert heat from a barrel of a firearm into usable electricity. Briefly described, in architecture, one embodiment of the system comprises a thermoelectric generator that is secured to an interface that resides between a firearm's handguard and the firearm's barrel. The interface has a mounting surface, e.g., a curved surface that conforms substantially to a curvature of the barrel. The interface also has a mounting surface on which the thermoelectric generator is secured. The system can also include a biasing structure (e.g., spring) that applies a force to the interface so that the curved surface of the interface maintains contact with the barrel. As the firearm discharges, the barrel becomes hot and generates heat. The heat from the barrel is conveyed to the thermoelectric generator through the interface. The thermoelectric generator converts the heat from the barrel to electricity, which can then be coupled to a battery, e.g., to be used to power battery-operated equipment on the firearm, to power other battery-operated devices, etc.

Example Firearm

Figure 2:
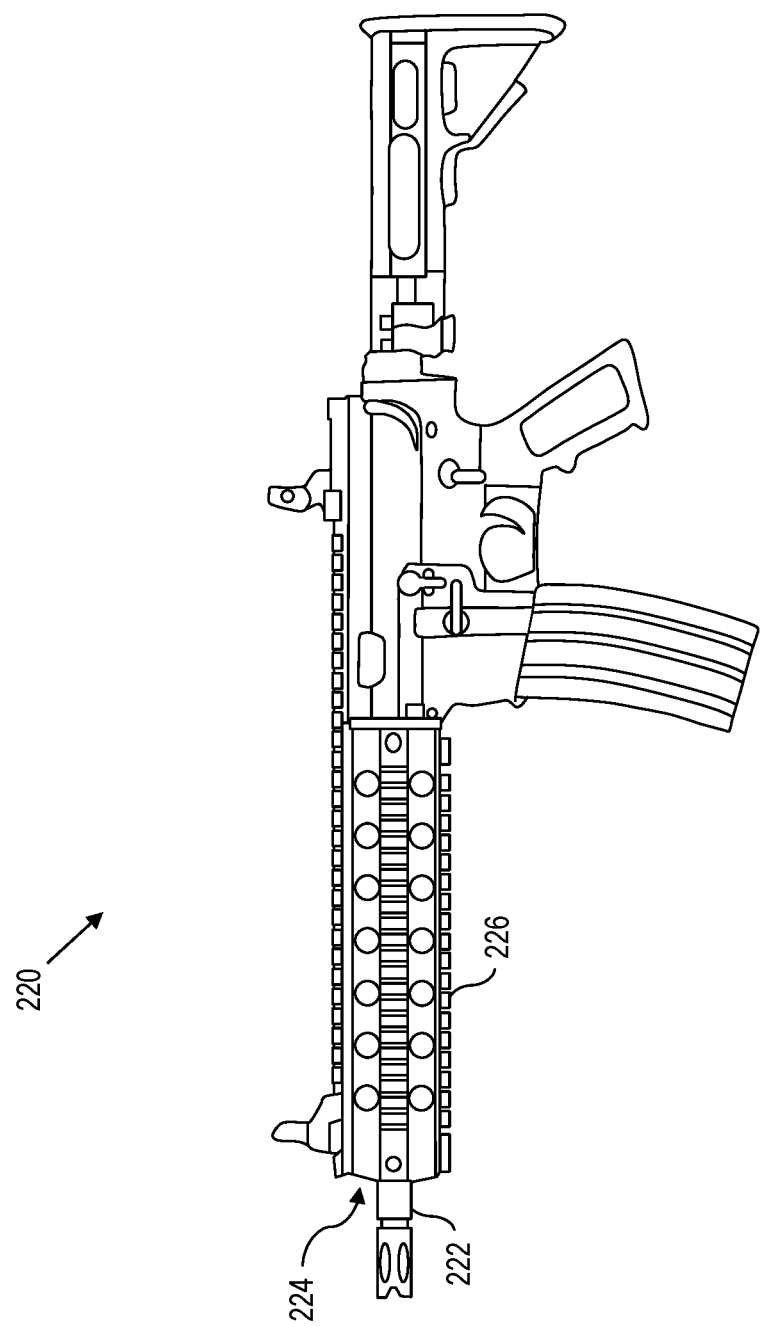
FIG. 2 is an illustration of a rifle having a barrel, demonstrating an example application for the energy conversion device of FIG. 1.

Referring to FIG. 2, a firearm implemented as a rifle 220 is illustrated. The rifle 220 includes in relevant part, a barrel 222. A gas discharge line 224 may run substantially parallel to the barrel, slightly spaced therefrom. In this regard, a handguard 226 is positioned over a portion of the barrel 222 and gas discharge line 224.

By way of non-limiting example, a typical weapon for a soldier includes a service rifle (e.g., M4 carbine, M14, M16A4, etc.). The service rifle is often equipped with sights or other equipment that sometimes requires a battery for proper operation (e.g., night-vision scopes, laser targeting mechanisms, etc.). As one can imagine, proper functioning of these electrically powered devices is crucial in combat situations.

The disclosed systems and processes teach an energy conversion device that coverts heat from a barrel of a firearm to electricity. As the firearm discharges, the barrel becomes hot and generates heat, which is converted to electricity by the disclosed system. The electricity can be used to power battery-operated equipment on the firearm.

Figure 3:
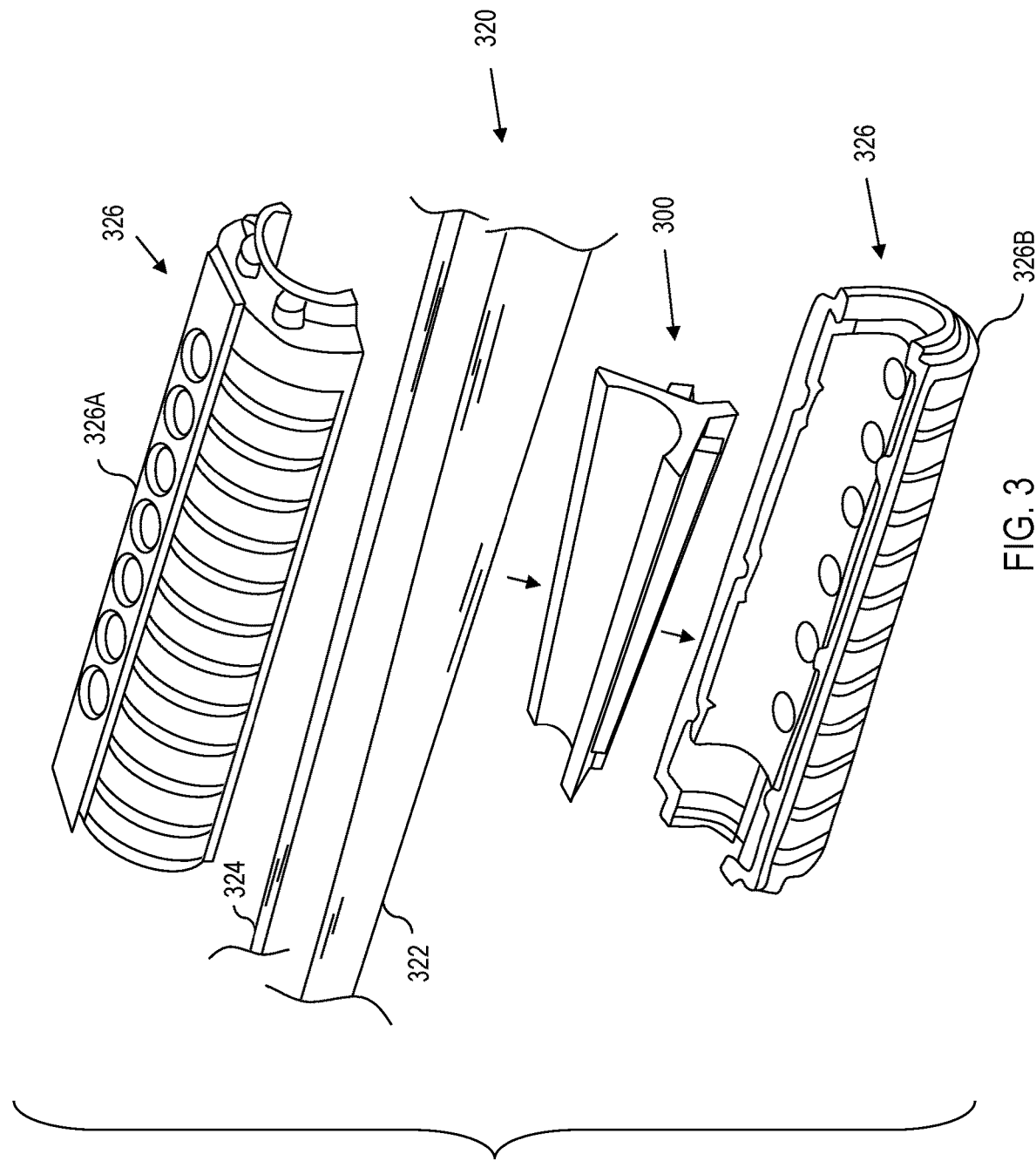
FIG. 3 is an exploded partial view of a firearm, such as the rifle of FIG. 2, illustrating a handguard removed from a barrel, and an energy conversion device within the handguard that converts heat energy from the barrel into electrical energy.

Referring to FIG. 3, in some embodiments, an energy conversion device 300, e.g., analogous to the energy conversion device 100 of FIG. 1, is provided to extract heat from the barrel of a firearm, e.g., analogous to the barrel 222 of the rifle 220 (FIG. 2), and to covert the collected heat into electricity, which is delivered to a load (e.g., battery, source requiring electrical power, etc.).

The energy conversion device 300 is analogous to the energy conversion device 100 of FIG. 1 and as such, like reference is illustrated with like reference numbers 200 higher. As such, only differences will be discussed in detail. Likewise, the firearm 300 is analogous in relevant respects, to the rifle 200 of FIG. 2, and as such, like reference numbers are illustrated with like reference numbers 100 higher.

Analogous to that of FIG. 1, the energy conversion device 300 includes an interface having a contact surface. The illustrated contact surface makes contact (e.g., direct, physical contact) with the barrel 322 of the firearm 320 (only partially shown). As noted more fully herein, the interface is located between the barrel and the handguard, and the contact surface makes contact along the barrel. In this regard, the length of the interface will vary according to the corresponding barrel length. Correspondingly, the configuration of the contact surface of the interface may be configured to snuggly mate with the outside diameter of the barrel. In this manner, the contact surface of the interface comprises a curved surface that conforms substantially to a curvature of the barrel. Thus, when the curved surface contacts the barrel, there is a substantial overlap in the surface areas of the contact surface of the interface and the barrel, thereby allowing for greater heat transfer from the barrel to the interface.

Preferably, the interface comprises a heat-conducting material that conducts heat from the contact surface to the mounting surface efficiently. In the embodiment of FIG. 3, the mounting surface is a substantially flat surface to accommodate the particular thermoelectric generator that is illustrated. In this manner, the size and shape of the mounting surface can vary according to the application and thermoelectric generator device(s) utilized.

Also analogous to FIG. 1, the embodiment of FIG. 3 further comprises a biasing structure, such as a spring, coil, or other flexible mechanism, rigid mechanism, etc. which applies a force to the interface so that the contact surface substantially maintains contact with the barrel. The biasing mechanism may also reduce rattling, may protect the energy conversion device from vibration or other detrimental effects, etc.

In practical applications, the firing of rounds from the firearm causes the barrel 322 to heat up. Heat from the barrel 322 transfers to the interface of the energy conversion device 300 via the contact surface. Furthermore, because the heat from the barrel is transmitted through the heat-conducting material of the interface to the mounting surface, the thermoelectric generator also becomes hot as the firearm discharges. That heat is converted to electricity by the thermoelectric generator. The electricity travels along electrical wires (332, 334) to a load, circuit, device, etc. For instance, as illustrated, the electrical wires schematically include a positive lead for electrically coupling, for example, to a positive terminal of a battery, and a negative lead for electrically coupling, for example, to a negative terminal of a battery. In other embodiments, the pair of wires couple to an electrical management system (which itself may include a battery and other circuitry, e.g., a DC-DC (direct current) convertor, filter, regulator, load(s), etc.). In yet other embodiments, the pair of wires connect to a load, circuit, signal conditioner, device, combination thereof, etc.

Analogous to the embodiment of FIG. 1, in the embodiment of FIG. 3, the system can further comprise a heat sink that is secured to the thermoelectric generator. The heat sink dissipates heat away from the thermoelectric generator, thereby reducing potential breakdown due to extreme heat. Thus, for some embodiments, the system further comprises a heat shield that insulates (to some extent) the handguard from the dissipated heat from the heat sink.

In some applications, the hand guard 326 can be implemented as a clamshell, i.e., handguard section 326A and handguard section 326B. This allows the handguard 326 to be removed from the firearm and re-installed on the firearm.

In some embodiments, the energy conversion device is mounted within a hollow of one of the handguard sections (e.g., handguard section 326B - a bottom section). This allows the energy conversion device 300 to be installed and removed from the firearm without any additional steps that would not otherwise be required to remove the handguard. Moreover, this makes replacement of the energy conversion device easy, as the energy conversion device can be snapped out of the handguard section 326B, and a replacement energy conversion device can be snapped into place.

Here, the energy conversion device 300 is installable within the hand guard 326 (e.g., in the handguard section 326B as illustrated). In this configuration, a user can attach and remove the handguard 326 from the barrel 322 in such a way that assembly of the handguard 326 to the barrel 322 of the firearm 320 automatically contacts the interface 302 to the barrel 322. Here, the biasing structure 306 automatically urges the interface 302 against the barrel 320 when the handguard is installed.

In some embodiments, to further improve thermal conductivity between the interface and the thermoelectric generator, a thermal paste (not shown) is applied between the mounting surface of the interface and the thermoelectric generator. Optionally, thermal paste (not shown) can also be applied between the contact surface of the interface and the barrel, thereby improving heat transfer between the barrel and the interface.

Figure 4:
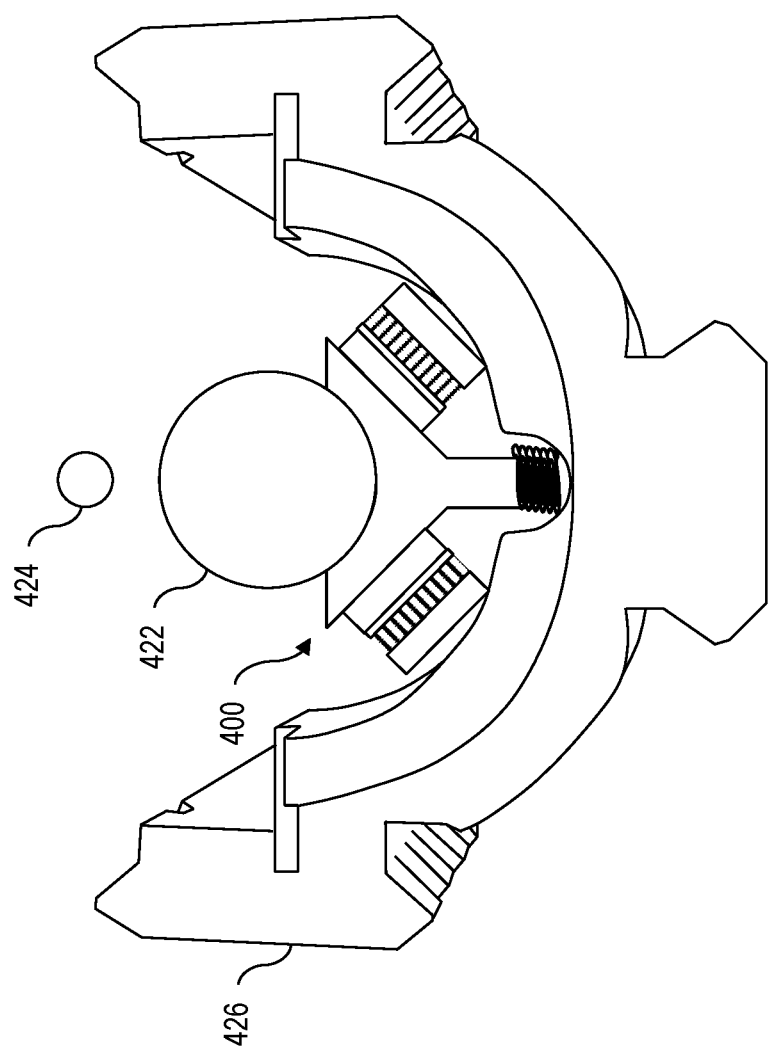
FIG. 4 is an end view of a portion of a handguard and energy conversion device according to an example embodiment.

Referring briefly to FIG. 4, an end view illustrates an energy conversion device 400 which is analogous to the energy conversion device 100 of FIG. 1 making physical contact with a barrel 422 of a firearm. the illustrated embodiment shows the energy conversion device 400 out of the way of the gas discharge line 424 of the firearm. Moreover, the energy conversion device 400 is mounted in a clamshell portion of a handguard 426. Here, the barrel 422, gas discharge line 424, and handguard 426 are analogous to those described more fully herein.

In some embodiments, the shape of the interface can vary to accommodate the handguard or other abutment surface. In other embodiments, multiple instances of the energy conversion device 400 can be implemented.

Figure 5:
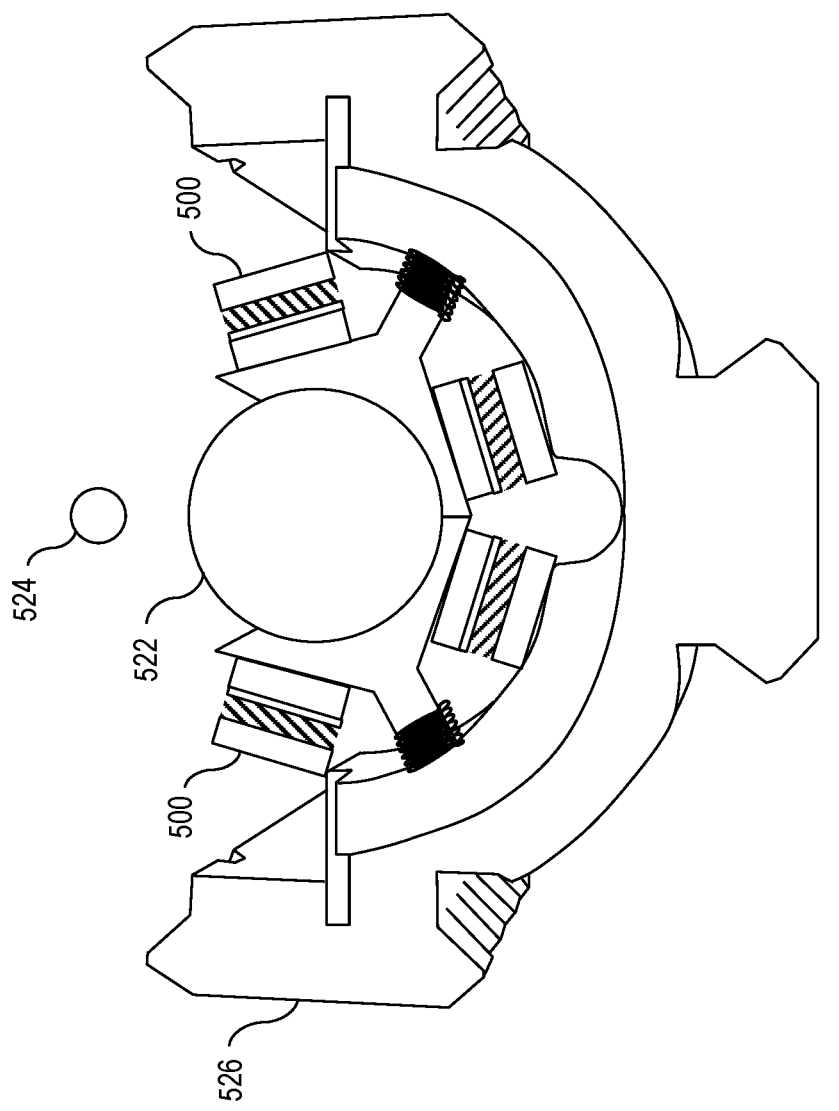
FIG. 5 is an end view of a portion of a handguard and energy conversion device according to another example embodiment.

Referring briefly to FIG. 5, an end view illustrates multiple instances of an energy conversion device 500, which are analogous to the energy conversion device 100 of FIG. 1, each making physical contact with a barrel 522 of a firearm. the illustrated embodiment shows the energy conversion devices 500 are out of the way of the gas discharge line 424 of the firearm. Moreover, the energy conversion devices 500 are mounted in a clamshell portion of a handguard 526. Here, the barrel 522, gas discharge line 524, and handguard 526 are analogous to those like structures described more fully herein.

It should be appreciated by those having skill in the art that the heat-to-electricity conversion can be implemented on structure that generates heat, but is well suited for use on a firearm, and is particularly well suited for use on any service rifle with a barrel and a handguard.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims below are intended to include any structure, material, or act for performing the function in combination with other claimed elements as specifically claimed. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. Aspects of the disclosure were chosen and described in order to best explain the principles of the disclosure and the practical application, and to enable others of ordinary skill in the art to understand the disclosure for various embodiments with various modifications as are suited to the particular use contemplated.

What is claimed is:

1. A system comprising:
   an interface comprising:
      a contact surface that conforms substantially to at least a portion of a structure providing a source of heat; and
      a mounting surface; and
   a thermoelectric generator secured to the mounting surface of the interface;
   wherein the system is dimensioned to fit inside a handguard of a firearm such that the contact surface of the interface contacts a barrel of the firearm; and
   a spring biasing structure for applying a force between the handguard and the interface so that the contact surface substantially maintains contact with the structure providing the source of heat.

2. The system of claim 1, wherein the biasing structure is a spring.

3. The system of claim 1, wherein the mounting surface is substantially flat.

4. The system of claim 1, wherein the thermoelectric generator comprises:
   a positive lead; and
   a negative lead, the positive lead and negative lead for electrically coupling to at least one of:
      a battery;
      an electrical management system;
      a circuit;
      a signal conditioner; or
      a combination thereof.

5. The system of claim 1, wherein the interface comprises a heat-conducting material for conducting heat from the contact surface to the mounting surface.

6. The system of claim 1, further comprising a thermal paste interposed between the mounting surface and the thermoelectric generator.

7. The system of claim 1, further comprising a heat sink secured to the thermoelectric generator.

8. The system of claim 7, further comprising a heat shield over at least a portion of the heat sink.

9. In a rifle having a barrel and a handguard, a system comprising:
   an interface comprising:
      a curved surface that conforms substantially to a curvature of the barrel, the curved surface for receiving heat from the barrel;
      a substantially flat mounting surface; and
      a heat-conducting material disposed between the curved surface and the substantially flat mounting surface, the heat-conducting material for conducting the heat from the curved surface to the substantially flat mounting surface;
   a spring positioned between the interface and the handguard, the spring for applying a force to the interface so that the curved surface substantially maintains contact with the barrel; and
   a thermoelectric generator secured to the substantially flat mounting surface, the thermoelectric generator comprising:
      a positive lead; and
      a negative lead, the positive lead and negative lead for electrically coupling to at least one of:
         a battery;
         an electrical management system;
         a circuit;
         a signal conditioner; or
         a combination thereof.

10. The system of claim 9, further comprising:
    a thermal paste interposed between the substantially flat mounting surface and the thermoelectric generator.

11. The system of claim 9, further comprising:
    a heat sink secured to the thermoelectric generator, the heat sink for dissipating heat away from the thermoelectric generator.

12. A firearm having
    a barrel;
    a handguard covering at least a portion of the barrel; and
    an energy conversion device within the handguard, the energy storage device comprising:
    an interface comprising:
       a curved surface that conforms substantially to a curvature of the barrel, the curved surface for receiving heat from the barrel;
       a substantially flat mounting surface; and
       a heat-conducting material disposed between the curved surface and the substantially flat mounting surface, the heat-conducting material for conducting the heat from the curved surface to the substantially flat mounting surface;
    a spring positioned between the interface and the handguard, the spring for applying a force to the interface so that the curved surface substantially maintains contact with the barrel; and
    a thermoelectric generator secured to the substantially flat mounting surface, the thermoelectric generator comprising:
       a positive lead; and
       a negative lead, the positive lead and negative lead for electrically coupling to at least one of:
          a battery;
          an electrical management system;
          a circuit;
          a signal conditioner; or
          a combination thereof.

* * * * *